United States Patent
Moon et al.

(10) Patent No.: US 9,281,240 B2
(45) Date of Patent: Mar. 8, 2016

(54) METHODS OF MANUFACTURING SEMICONDUCTOR DEVICES

(71) Applicant: Samsung Electronics Co., Ltd., Suwon-si (KR)

(72) Inventors: Hyo-Jeong Moon, Yongin-si (KR); Woo-Choel Noh, Hwaseong-si (KR); Woo-Jin Jang, Seoul (KR); Hun Kim, Yongin-si (KR); Hong-Jae Shin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/635,017

(22) Filed: Mar. 2, 2015

(65) Prior Publication Data

US 2015/0255336 A1    Sep. 10, 2015

(30) Foreign Application Priority Data

Mar. 6, 2014   (KR) .................. 10-2014-0026377

(51) Int. Cl.
*H01L 21/768*    (2006.01)

(52) U.S. Cl.
CPC .... *H01L 21/76871* (2013.01); *H01L 21/76802* (2013.01); *H01L 21/76831* (2013.01); *H01L 21/76832* (2013.01); *H01L 21/76879* (2013.01)

(58) Field of Classification Search
CPC ... H01L 21/76871–21/76876; H01L 21/76879
See application file for complete search history.

(56) References Cited

U.S. PATENT DOCUMENTS

| | | | |
|---|---|---|---|
| 6,197,167 B1 | 3/2001 | Tanaka | |
| 7,645,699 B2 | 1/2010 | Lee | |
| 7,795,138 B2 | 9/2010 | Chiang et al. | |
| 7,855,147 B1 | 12/2010 | Dulkin et al. | |
| 8,298,933 B2 | 10/2012 | Shaviv et al. | |
| 8,298,936 B1 | 10/2012 | Rozbicki et al. | |
| 8,431,033 B2 | 4/2013 | Zhou et al. | |
| 8,491,759 B2 | 7/2013 | Pipitone et al. | |
| 2006/0030151 A1* | 2/2006 | Ding .................... | H01L 21/2855 438/687 |
| 2008/0311711 A1 | 12/2008 | Hampp et al. | |
| 2009/0321247 A1 | 12/2009 | Cerio, Jr. et al. | |
| 2010/0252417 A1 | 10/2010 | Allen et al. | |
| 2011/0311735 A1 | 12/2011 | Wang et al. | |
| 2012/0097525 A1 | 4/2012 | Harkness, IV et al. | |
| 2012/0218621 A1 | 8/2012 | Kwak et al. | |
| 2013/0056348 A1 | 3/2013 | Papa et al. | |
| 2013/0149469 A1 | 6/2013 | Shao et al. | |
| 2013/0156936 A1 | 6/2013 | Fong et al. | |
| 2013/0199925 A1 | 8/2013 | Cao et al. | |

* cited by examiner

Primary Examiner — Daniel Shook
(74) Attorney, Agent, or Firm — Onello & Mello, LLP

(57) ABSTRACT

In a method of manufacturing a semiconductor device, an insulating interlayer is formed on a substrate. The insulating interlayer is partially removed to form an opening. A barrier conductive layer is formed on a sidewall and a bottom of the opening. An RF sputtering process and a DC sputtering process are performed independently on the barrier conductive layer to form a seed layer. A plated layer is formed on the seed layer.

20 Claims, 18 Drawing Sheets

METHODS OF MANUFACTURING SEMICONDUCTOR DEVICES

CROSS-REFERENCE TO RELATED APPLICATION

This application claims priority under 35 USC §119 to Korean Patent Application No. 10-2014-0026377, filed on Mar. 6, 2014 in the Korean Intellectual Property Office (KIPO), the contents of which are incorporated by reference herein in their entirety.

BACKGROUND

1. Technical Field

Example embodiments relate to methods of manufacturing semiconductor devices. More particularly, example embodiments relate to methods of manufacturing semiconductor devices including conductive patterns.

2. Description of the Related Art

In a semiconductor device, a conductive pattern such as a via structure or a contact for an interconnection between wirings may be formed. For example, an insulation layer may be etched to form a via hole through which a lower wiring is exposed, and a conductive layer may be formed in the via hole.

As a degree of integration becomes increased, a width of the via hole may be decreased. Thus, a desired deposition property, e.g., a gap-fill property may be deteriorated, and thus the conductive layer may not be formed uniformly in the via hole.

SUMMARY

Example embodiments provide a method of manufacturing a semiconductor device having improved electrical and mechanical properties.

Example embodiments provide a layer deposition system having an improved deposition property.

A method of manufacturing a semiconductor device according to an embodiment of the inventive concepts is provided. In the method, an insulating interlayer is formed on a substrate. The insulating interlayer is partially removed to form an opening. A barrier conductive layer is formed on a sidewall and a bottom of the opening. A radio frequency (RF) sputtering process and a direct current (DC) sputtering process are formed independently on the barrier conductive layer to form a seed layer. A plated layer is formed on the seed layer.

In an embodiment, the RF sputtering process and the DC sputtering process may be performed alternately and repeatedly.

In an embodiment, the RF sputtering process and the DC sputtering process may be formed in different process chambers.

In an embodiment, the RF sputtering process may include applying a high frequency (HF)-RF power ranging from about 40 kHz to about 40 MHz, and the DC sputtering process may include a DC magnetron sputtering process.

In an embodiment, a lower wiring may be formed on the substrate. The lower wiring may be at least partially exposed through the opening.

In an embodiment, the opening may include a lower portion exposing the lower wiring, and an upper portion having a greater width than that of the lower portion.

In an embodiment, the opening may include a first sidewall extending commonly throughout the upper portion and the lower portion, a second sidewall defining the lower portion together with the first sidewall, and a third sidewall defining the upper portion together with the first sidewall. The second sidewall may be tapered with respect to a top surface of the substrate relatively to the first sidewall and the third sidewall.

In an embodiment, the insulating interlayer may include a first insulating interlayer and a second insulating interlayer sequentially on the substrate. A boundary between the upper portion and the lower portion may be defined by an interface between the first insulating interlayer and the second insulating interlayer.

In an embodiment, the seed layer may include copper, and the plated layer may be grown from the seed layer by an electroplating process.

A method of manufacturing a semiconductor device according to an embodiment is provided. In the method, a circuit device is formed on a substrate. A first insulating interlayer covering the circuit device is formed. Lower wirings electrically connected to the circuit device are formed on the first insulating interlayer. A second insulating interlayer is formed on the lower wirings and the first insulating interlayer. The second insulating interlayer is partially removed to form a first opening through which at least a portion of the lower wirings is exposed. A first barrier conductive layer pattern is formed on a sidewall and a bottom of the first opening. An RF sputtering process and a DC sputtering process are performed independently of each other and alternately on the first barrier conductive layer pattern to form a first seed layer pattern. A first plated layer pattern is formed on the first seed layer pattern such that a first conductive pattern including the first barrier conductive layer pattern, the first seed layer pattern and the first plated layer pattern sequentially stacked in the first opening is formed.

In an embodiment, a third insulating interlayer covering the first conductive pattern may be formed on the second insulating interlayer. The third insulating interlayer may be partially removed to form a second opening through which the first conductive pattern is exposed. A second barrier conductive layer pattern is formed on a sidewall and a bottom of the second opening. An RF sputtering process and a DC sputtering process are performed independently of each other and alternately on the second barrier conductive layer pattern to form a second seed layer pattern. A second plated layer pattern is formed on the second seed layer pattern such that a second conductive pattern including the second barrier conductive layer pattern, the second seed layer pattern and the second plated layer pattern sequentially stacked in the second opening is formed.

In an embodiment, a third insulating interlayer covering the first conductive pattern is formed on the second insulating interlayer. The third insulating interlayer and the second insulating interlayer partially removed to form a third opening through which the lower wiring is exposed. An upper portion of the third opening is expanded. A third barrier conductive layer pattern is formed on a sidewall and a bottom of the third opening. An RF sputtering process and a DC sputtering process are performed independently and alternately on the third barrier conductive layer pattern to form a third seed layer pattern. A third plated layer pattern is formed on the third seed layer pattern such that a third conductive pattern including the third barrier conductive layer pattern, the third seed layer pattern and the third plated layer pattern sequentially stacked in the third opening is formed.

In an embodiment, the first conductive pattern may be exposed through the upper portion of the third opening.

In an embodiment, a through electrode extending through the first insulating interlayer and at least partially through the substrate may be formed. The through electrode may be electrically connected to at least a portion of the lower wirings.

In an embodiment, the through electrode may be electrically connected to a portion of the third conductive pattern formed in the upper portion of the third opening via the first conductive pattern.

A method of manufacturing a semiconductor device according to an embodiment is provided. In the method, a semiconductor substrate is loaded in an RF sputtering chamber including a first target therein. An RF power is applied to the first target such that a first conductive layer is deposited on the semiconductor substrate. The semiconductor substrate is loaded in a DC sputtering chamber including a second target therein. A DC power is applied to the second target such that a second conductive layer is deposited on the semiconductor substrate.

In an embodiment, the semiconductor substrate may be loaded alternately and repeatedly in the RF sputtering chamber and the DC sputtering chamber. The first conductive layer and the second conductive layer may be deposited alternately and repeatedly.

In an embodiment, a bias power may be applied to the semiconductor substrate through a bias power supply commonly coupled to the RF sputtering chamber and the DC sputtering chamber.

In an embodiment, a DC power may be applied to the first target together with the RF power. The DC power applied to the first target may range from about 1 kW to about 8 kW, and the DC power applied to the second target may range from about 10 kW to about 30 kW.

In an embodiment, the first and second targets include copper.

A layer deposition system according to an embodiment is provided. The layer deposition system includes a first deposition chamber for an RF sputtering process, a second deposition chamber for a DC sputtering process, a transfer chamber by which a substrate is transferred between the first and second deposition chambers, an RF power supply applying an RF power to a first target in the first deposition chamber, and a DC power supply applying a DC power to a second target in the second deposition chamber.

In an embodiment, the first deposition chamber and the second deposition chamber may include a first supporter and a second supporter, respectively, on which the substrate is loaded.

In an embodiment, the layer deposition system may further include a bias power supply coupled to the first and second supporters.

In an embodiment, the layer deposition system may further include a magnet assembly located on the second target.

In an embodiment, the layer deposition system may further include a transfer plate in the transfer chamber on which the substrate is transferred.

In an embodiment, the DC power supply may be coupled commonly to the first target and the second target, and may apply different DC powers to the respective first and second targets.

In an embodiment, the layer deposition system may further include a vacuum pump commonly coupled to the first deposition chamber, the transfer chamber and the second deposition chamber.

According to an embodiment of the present inventive concepts, a layer deposition system may include a DC deposition chamber and an RF deposition chamber. Thus, a DC sputtering process having an improved horizontal deposition property and an RF sputtering process having an improved vertical deposition property may be combined so that a conductive layer having a uniform profile may be formed in a via hole. Therefore, the conductive layer may not be overhung at an upper portion of the via hole, and thus a void or a discontinuous formation of the conductive layer may be prevented.

BRIEF DESCRIPTION OF THE DRAWINGS

Example embodiments will be more clearly understood from the following detailed description taken in conjunction with the accompanying drawings. FIGS. 1 to 30 represent non-limiting, example embodiments as described herein.

FIG. 1 is a schematic cross-sectional view illustrating a layer deposition system in accordance with example embodiments;

FIG. 2 a schematic cross-sectional view illustrating a layer deposition system in accordance with example embodiments;

FIGS. 3 to 9B are cross-sectional views illustrating a method of forming a conductive pattern in accordance with example embodiments;

FIGS. 11 to 19 are cross-sectional views illustrating a method of forming a conductive pattern in accordance with example embodiments;

FIGS. 21 to 24 are cross-sectional views illustrating a method of forming a conductive pattern in accordance with example embodiments; and FIGS. 25 to 30 are cross-sectional views illustrating a method of manufacturing a semiconductor device in accordance with example embodiments.

DESCRIPTION OF EMBODIMENTS

Figure 1:
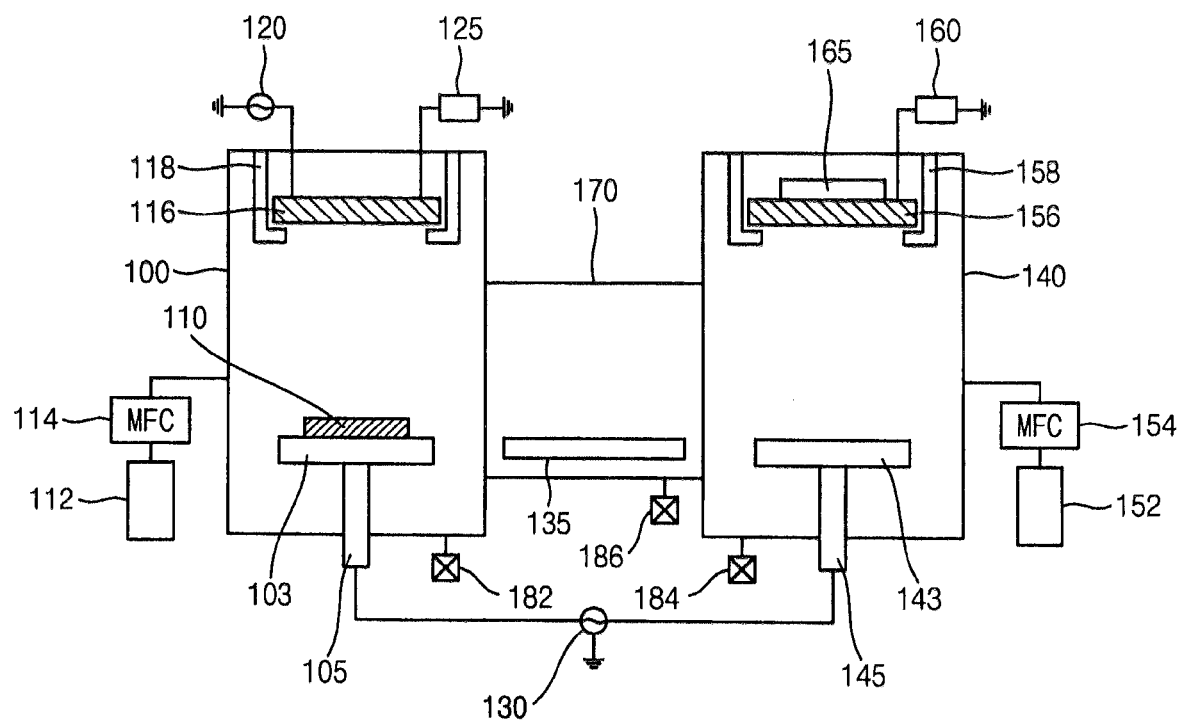

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art.

It will be understood that when an element or layer is referred to as being "on," "connected to" or "coupled to" another element or layer, it can be directly on, connected or coupled to the other element or layer or intervening elements or layers may be present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These teens are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic cross-sectional view illustrating a layer deposition system in accordance with example embodiments.

Referring to FIG. 1, the layer deposition system may include a first deposition chamber 100 and a second deposition chamber 140. The layer deposition system may further include a transfer chamber 170 by which a deposition object such as a semiconductor substrate may be transferred between the first and second deposition chambers 100 and 140.

In an embodiment, the first deposition chamber 100 may be a radio frequency (RF) sputtering deposition chamber in which a physical vapor deposition (PVD) process using an RF power source may be performed.

A first shield 118 may be located at an upper space in the first deposition chamber 100 to support a first target 116. The first target 116 may be located at the upper portion in the first deposition chamber 100, and may be at least partially exposed through the first shield 118.

The first target 116 may include a metal such as, for example, copper (Cu), titanium (Ti), tantalum (Ta), tungsten (W) and aluminum (Al), or an alloy thereof. In an embodiment, the first target 116 may include copper.

An RF power supply 120 may be located outside of the first deposition chamber 100 and may be coupled to the first target 116. A high frequency (HF)-RF power may be applied to the first target 116 by the RF power supply 120. For example, the HF-RF power may range from about 400 kHz to about 40 MHz. In an embodiment, the HF-RF power may range from about 10 MHz to about 40 MHz.

In an embodiment, a first direct current (DC) power supply 125 may be further coupled to the first target 116. In an embodiment, the first deposition chamber 100 may be a DC/RF sputtering deposition chamber.

A first supporter 103 may be located at a lower space in the first deposition chamber 100. A substrate 110 may be loaded on the first supporter 103. For example, the substrate 110 may be a semiconductor wafer including a single crystalline silicon or a single crystalline germanium.

In an embodiment, a plurality of the substrates 110 may be loaded on the first supporter 103. For example, a susceptor including a plurality of slots may be placed on the first supporter 103, and the substrate 110 may be loaded on each slot.

The first supporter 103 may be rotatably combined with a first chuck 105. The first chuck 105 may extend through the first deposition chamber 100.

A bias power supply 130 may be coupled to the first supporter 103 via the first chuck 105. An RF-bias power may be applied to the first supporter 103 by the bias power supply 130 such that a reactive gas or active species separated from the first target 116 may be accelerated toward the substrate 110. For example, the RF-bias power ranging from about 10 MHz to about 20 MHz may be applied through the bias power supply 130.

For example, a first reactive gas supply 112 may be provided at an outer lateral portion of the first deposition chamber 100 to be in a fluid-communication with the first deposition chamber 100. The reactive gas including, e.g., argon (Ar) or nitrogen ($N_2$) may be introduced into the first deposition chamber 100 by the first reactive gas supply 112.

In an embodiment, a first mass flow controller (MFC) may be interposed between the first reactive gas supply 112 and the first deposition chamber 100 to control a flow rate of the reactive gas.

In an embodiment, the second deposition chamber 140 may be a direct current (DC) sputtering deposition chamber in which a physical vapor deposition (PVD) process using a DC power source may be performed. For example, the second deposition chamber 140 may be a DC magnetron deposition chamber.

The second deposition chamber 140 may include a second shield 158, a second target 156, a second supporter 143, a second chuck 145, a second reactive gas supply 152 and a second MFC 154 which may have structures and/or constructions substantially the same as or similar to those of the first shield 118, the first target 116, the first supporter 103, the first chuck 105, the first reactive gas supply 112 and the first MFC 114, respectively, of the first deposition chamber 100.

In an embodiment, the above-mentioned RF-bias power may be applied to the second supporter 143 via the second chuck 145 by the bias power supply 130. In an embodiment, the bias power supply 130 may be coupled commonly to the first and second deposition chambers 100 and 140.

A magnet assembly 165 may be disposed on the second target 156. The magnet assembly 165 may include a fixed permanent magnet, a rotating permanent magnet, a magnetron, an electromagnet or a combination thereof. A magnetic field may be created by the magnet assembly 165. A density of the reactive gas or a plasma including active species separated from the second target 156 may be enhanced by the magnetic field.

A second DC power supply 160 may be located outside of the second deposition chamber 140 and may be coupled to the second target 156. Accordingly, a DC power may be applied to the second target 156 by the second DC power supply 160.

In an embodiment, the transfer chamber 170 may be located between the first and second deposition chambers 100 and 140. The transfer chamber 170 may include a transfer plate 135 therein. The substrate 110 may be loaded on the transfer plate 135 to be transferred between the first and second deposition chambers 100 and 140. In an embodiment, the transfer chamber 170 may further include a transfer robot for carrying the substrate 110.

In an embodiment, the substrate 110 may be repeatedly and alternately transferred into the first deposition chamber 100 and the second deposition chamber 140 by the transfer plate 135. For example, a conductive layer such as a metal layer may be deposited on the substrate 110 by an RF sputtering process performed in the first deposition chamber, and then the substrate 110 may be transferred in the second deposition chamber 140 so that an additional metal layer may be deposited by a DC sputtering process. The substrate 110 may be repeatedly transferred between the first and second deposition chambers 100 and 140 until a desired metal layer is formed on the substrate 110. Thus, the RF sputtering process and the DC sputtering process may be repeatedly and alternately performed.

In an embodiment, a first door may be provided at a lateral portion of the first deposition chamber 100 adjacent to the transfer chamber 170, and a second door may be provided at a lateral portion of the second deposition chamber 140 adjacent to the transfer chamber 170. Thus, the substrate 110 may be transferred through the first and second doors.

In an embodiment, the layer deposition system may be connected or combined with the transfer chamber 170, and may further include a load lock chamber for an introduction of the substrate 110 and an evacuation of the chambers.

In an embodiment, a first vacuum pump 182, a second vacuum pump 184 and a third vacuum pump 186 may be coupled with the first deposition chamber 100, the second deposition chamber 140 and the transfer chamber 170, respectively. The chambers may be evacuated through the first to third vacuum pumps 182, 184 and 186.

Figure 2:
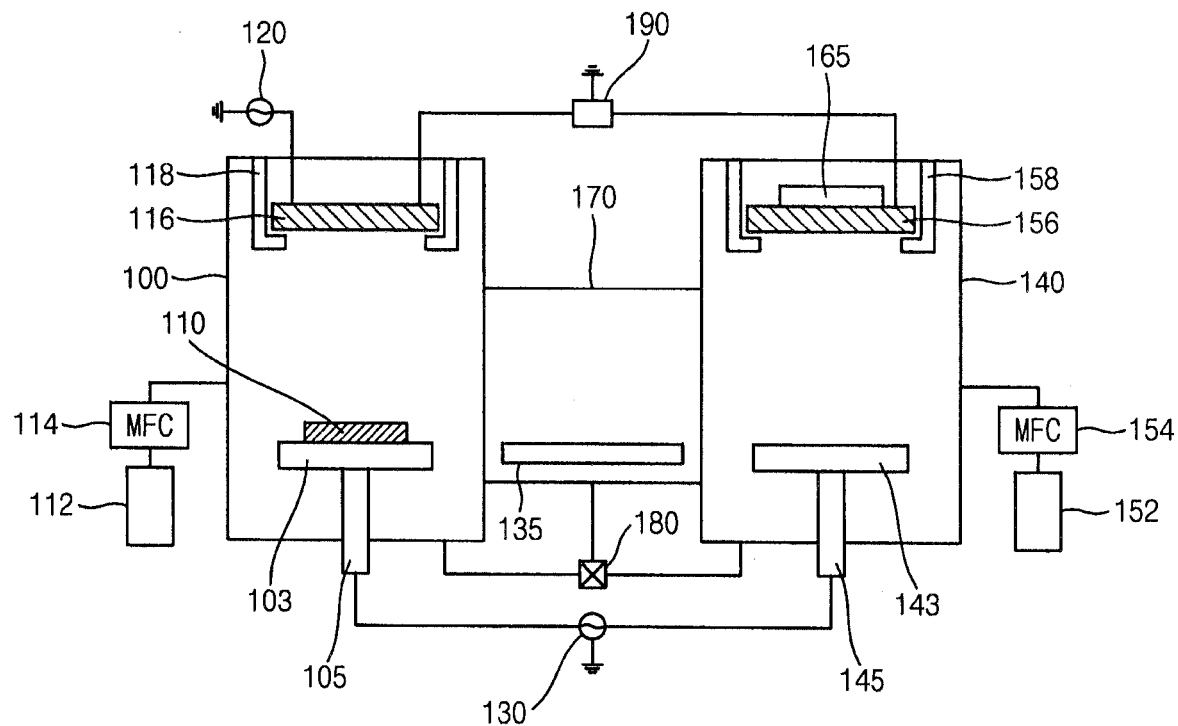

FIG. 2 a schematic cross-sectional view illustrating a layer deposition system in accordance with an exemplary embodiment.

Referring to FIG. 2, a DC power supply 190 may be commonly coupled to a first deposition chamber 100 and a second deposition chamber 140. In an embodiment, suitable DC powers for each of an RF sputtering process in the first deposition chamber 100 and a DC sputtering process in the second deposition chamber 140 may be applied to a first target 116 and a second target 156 by the DC power supply 190. In an embodiment, the DC powers applied to the respective first target 116 and the second target 156 may be different from each other.

In an embodiment, a vacuum pump 180 may be commonly coupled to the first deposition chamber 100, the second deposition chamber 140 and a transfer chamber 170. In an embodiment, a first valve, a second valve and a third valve may be interposed between the vacuum pump 180 and the first deposition chamber 100, between the vacuum pump 180 and the second deposition chamber 140, and between the vacuum pump 180 and the transfer chamber 170, respectively, to control an evacuation of each chamber.

FIGS. 3 to 9B are cross-sectional views illustrating a method of forming a conductive pattern in accordance with an exemplary embodiment.

Figure 3:
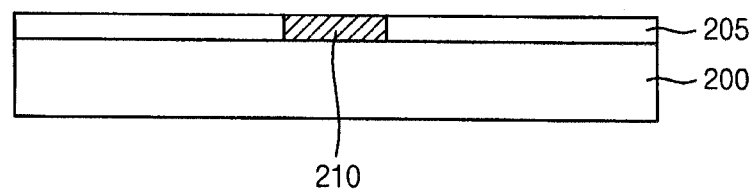

Referring to FIG. 3, a lower insulation layer 205 and a lower wiring 210 may be formed on a substrate 200.

A semiconductor substrate including silicon and/or germanium may be used as the substrate 200. A lower structure including a gate structure, an impurity region, a contact or a plug may be formed on the substrate 200.

The lower insulation layer 205 may be formed on the substrate 200 to cover the lower structure. The lower insulation layer 205 may be formed using silicon oxide such as plasma enhanced oxide (PEOX), tetraethyl orthosilicate (TEOS), boro tetraethyl orthosilicate (BTEOS), phosphorous tetraethyl orthosilicate (PTEOS), boro phospho tetraethyl orthosilicate (BPTEOS), boro silicate glass (BSG), phospho silicate glass (PSG), boro phospho silicate glass (BPSG), or the like. The lower insulation layer 205 may be formed by a process such as, for example, a chemical vapor deposition (CVD) process, a plasma enhanced chemical vapor deposition (PECVD) process, a low pressure chemical vapor deposition (LPCVD) process, a high density plasma chemical vapor deposition (HDP-CVD) process or a spin coating process.

In an embodiment, the lower insulation layer 205 may be partially removed to form a hole or a trench, and then a conductive layer filling the hole or the trench may be formed on the lower insulation layer 205. An upper portion of the conductive layer may be planarized until a top surface of the lower insulation layer 205B is exposed by, e.g., a chemical mechanical polish (CMP) process or an etch-back process to form the lower wiring 210. The lower wiring 210 may be electrically connected to the lower structure.

The conductive layer may be formed by a PVD process, an atomic layer deposition (ALD) process or a CVD process.

Figure 4:
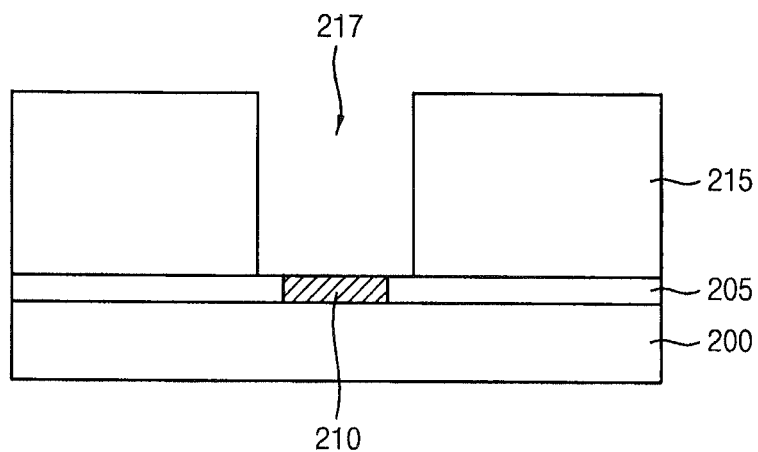

Referring to FIG. 4, an insulating interlayer 215 covering the lower wiring 210 may be formed on the lower insulation layer 205. The insulating interlayer 215 may be partially removed to form an opening 217 through which a top surface of the lower wiring 210 may be at least partially exposed.

In an embodiment, a photoresist layer may be formed on the insulating interlayer 215. The photoresist layer may be partially removed by exposure and developing processes to form a photoresist pattern partially exposing a top surface of the insulating interlayer 215. The insulating interlayer 215 may be partially etched using the photoresist pattern as an etching mask to form the opening 217.

The opening 217 may have a substantial hole shape or a substantial trench shape. In an example embodiment, the opening 217 may serve as a via hole. As illustrated in FIG. 4, the top surface of the lower wiring 210 may be fully exposed through the opening 217, and the top surface of the lower insulation layer 205 may be partially exposed through the opening 217. In an embodiment, the top surface of the lower wiring 210 may be partially exposed through the opening 217.

The insulating interlayer 215 may be formed using the above mentioned silicon oxide or silicon oxynitride by a CVD process or a spin coating process according to an exemplary embodiment. After the formation of the opening 217, the photoresist pattern may be removed by an ashing process and/or a strip process.

Figure 5:
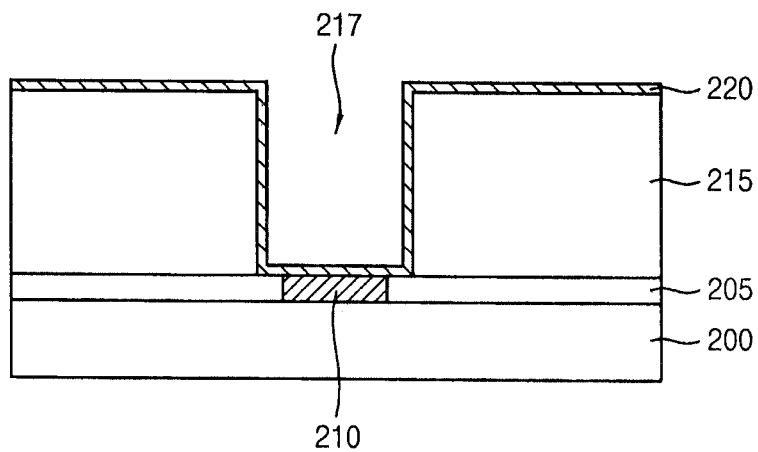

Referring to FIG. 5, a barrier conductive layer 220 may be formed along the top surface of the insulating interlayer 215, and a sidewall and a bottom of the opening 217. The barrier conductive layer 220 may contact the lower wiring layer 210 exposed through the opening 217.

In an embodiment, the barrier conductive layer 220 may be formed conformally on the top surface of the insulating interlayer 215 and on an innerwall of the opening 217 to have a thin thickness. The barrier conductive layer 220 may improve an adhesion of a seed layer 225 (see FIG. 6), and prevent a mass transfer between the seed layer 225 and the insulating interlayer 215, or between the seed layer 225 and the lower insulation layer 205.

For example, the barrier conductive layer 220 may be formed using titanium, titanium nitride, tantalum or tantalum nitride by a PVD process or an ALD process.

Figure 6:
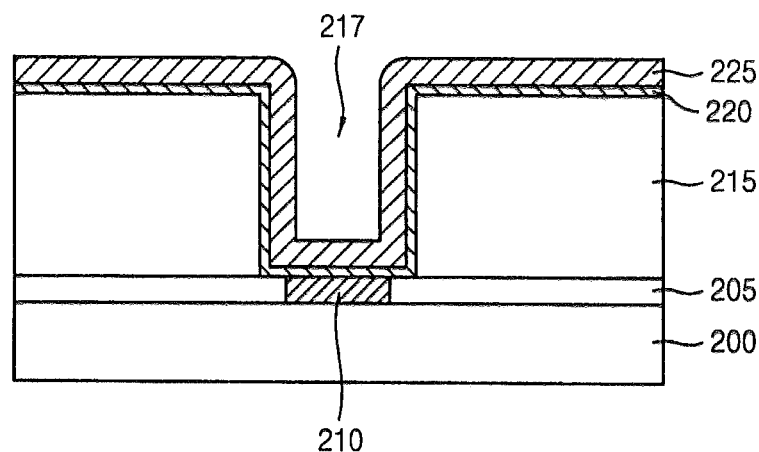

Referring to FIG. 6, the seed layer 225 may be formed on the barrier conductive layer 220.

The seed layer 225 may be formed conformably on a top surface of the barrier conductive layer 220 and may have a thickness greater than that of the barrier conductive layer 220. In an embodiment, the seed layer 225 may be formed by a PVD process using a metal target, e.g., a copper target. For example, the seed layer 225 may be formed utilizing the layer deposition system illustrated in FIG. 1 or FIG. 2.

In an embodiment, the seed layer 225 may be formed by a combination of an RF sputtering process and a DC sputtering process utilizing the layer deposition system.

For example, the substrate 200 including the barrier conductive layer 220 may be loaded on the first supporter 103 in the first deposition chamber 100 of the layer deposition system. A copper target as the first target 116 may be placed in the first shield 118. An HF-RF power ranging, e.g., from about 40 kHz to about 40 MHz may be applied to the first target 116 by the RF power supply 120.

In an embodiment, the HF-RF power may range from about 10 MHz to about 40 MHz. Further, a bias power ranging, e.g., from about 10 MHz to about 20 MHz may be applied to the first supporter 103 by the bias power supply 130. A reactive gas including, e.g., argon may be introduced into the first deposition chamber 100 through the first reactive gas supply 112 to be transformed into a plasma by the HF-RF power.

Accordingly, the RF sputtering process may be performed in the first deposition chamber 100 so that a metal layer, e.g., a copper layer may be formed on the barrier conductive layer 220. In an embodiment, a predetermined DC power may be applied to the first target 116 together with the HF-RF power through the first DC power supply 125. In an embodiment, a DC/RF sputtering process may be performed in the first deposition chamber 100.

In an embodiment, as illustrated in FIG. 2, the DC power may be applied through the DC power supply 190 commonly coupled to the first deposition chamber 100 and the second deposition chamber 140.

After the deposition process in the first deposition chamber 100, the substrate 200 may be transferred on the second supporter 143 in the second deposition chamber 140 via the transfer chamber 170.

For example, a DC sputtering process using a copper target substantially the same as the first target 116 may be performed in the second deposition chamber 140. As illustrated in FIGS. 1 and 2, if the magnet assembly 165 is disposed on the second target 156, a DC magnetron sputtering process may be performed in the second deposition chamber 140.

A predetermined DC power may be applied to the second target 156 by the second DC power supply 160 or the DC power supply 190, and a bias power may be applied to the second supporter 130 by the bias power supply 130. A reactive gas may be introduced into the second deposition chamber 140 through the second reactive gas supply 152.

In an embodiment, a DC power applied to the second target 156 (hereinafter, referred to as a second DC power) may be greater than a DC power applied to the first target 116 (hereinafter, referred to as a first DC power). For example, the second DC power may range from about 10 kW to about 30 kW, and the first DC power may range from about 1 kW to about 8 kW. If the first DC power is excessively increased, RF sputtering characteristics in the first deposition chamber 100 may be deteriorated.

An additional metal layer may be deposited on the barrier conductive layer 220 by the DC sputtering process in the second deposition chamber 140 to form the seed layer 225.

In an embodiment, after the DC sputtering process in the second deposition chamber 140, the substrate 200 may be transferred again into the first deposition chamber 100 so that the RF sputtering process may be performed on the substrate 200. The substrate 200 may be transferred into the second deposition chamber 140 so that the DC sputtering process may be performed again on the substrate 200. The RF sputtering process and the DC sputtering process may be performed repeatedly and alternately until the seed layer 225 having predetermined layer thickness and/or profile is obtained.

In an embodiment, the substrate 200 may be loaded in the first deposition chamber 100 in an initial step, and thus the RF sputtering process may be performed in advance of the DC sputtering process. In an embodiment, the substrate 200 may be loaded in the second deposition chamber 140 in an initial step, and thus the DC sputtering process may be performed in advance of the RF sputtering process.

Figure 7:
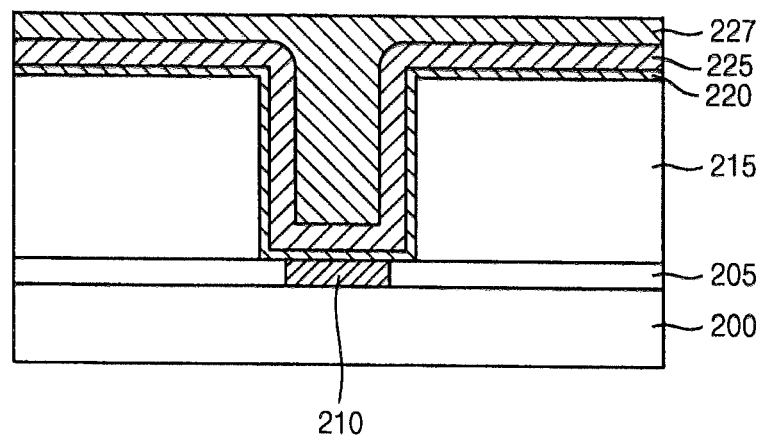

Referring to FIG. 7, a plated layer 227 may be formed on the seed layer 225. The plated layer 227 may sufficiently fill a remaining portion of the opening 217.

In an embodiment, the plated layer 227 may be formed by an electroplating process. For example, the plated layer 227 may be formed by a copper electroplating process.

For example, the substrate 200 including the seed layer 225 may be immersed in a plating solution including, e.g., copper sulfate, and then a current may be applied using the seed layer 225 and the plating solution as a cathode and an anode, respectively. Accordingly, the seed layer 227 including copper may be precipitated or grown on the seed layer 225 through an electrochemical reaction.

Figure 8:
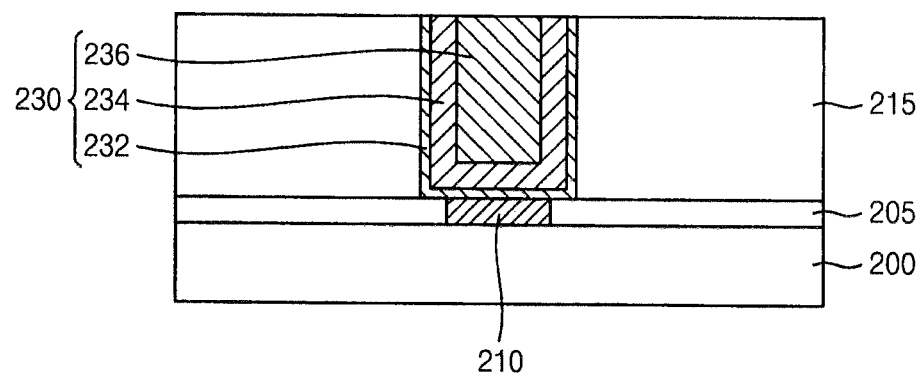

Referring to FIG. 8, upper portions of the plated layer 227, the seed layer 225 and the barrier conductive layer 220 may be planarized to form a plated layer pattern 236, a seed layer pattern 234 and a barrier layer pattern 232.

In an embodiment, the plated layer 227, the seed layer 225 and the barrier conductive layer 220 may be polished by, e.g., a CMP process and/or an etch-back process until the top surface of the insulating interlayer 215 is exposed. Accordingly, a conductive pattern 230 including the barrier conductive layer pattern 232, the seed layer pattern 234 and the plated layer pattern 236 sequentially stacked in the opening 217 may be formed. The conductive pattern 230 may be in contact with or electrically connected to the lower wiring 210.

Figure 9A:
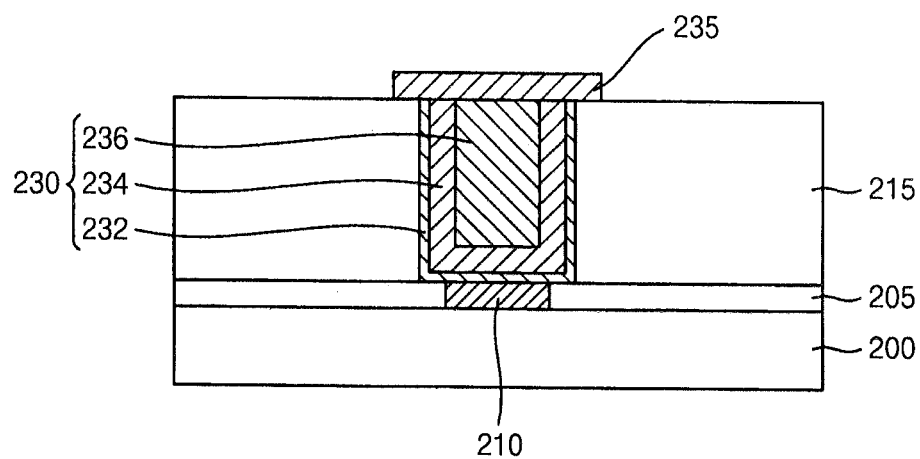

Referring to FIG. 9A, an upper wiring 235 may be formed on the conductive pattern 230 and the insulating interlayer 215. For example, a conductive layer may be formed on the conductive pattern 230 and the insulating interlayer 215, and then the conductive layer may be partially etched by a photolithography process to form the upper wiring 235. In an embodiment, the conductive pattern 230 may serve as an interconnection structure between the lower wiring 210 and the upper wiring 235.

Figure 9B:
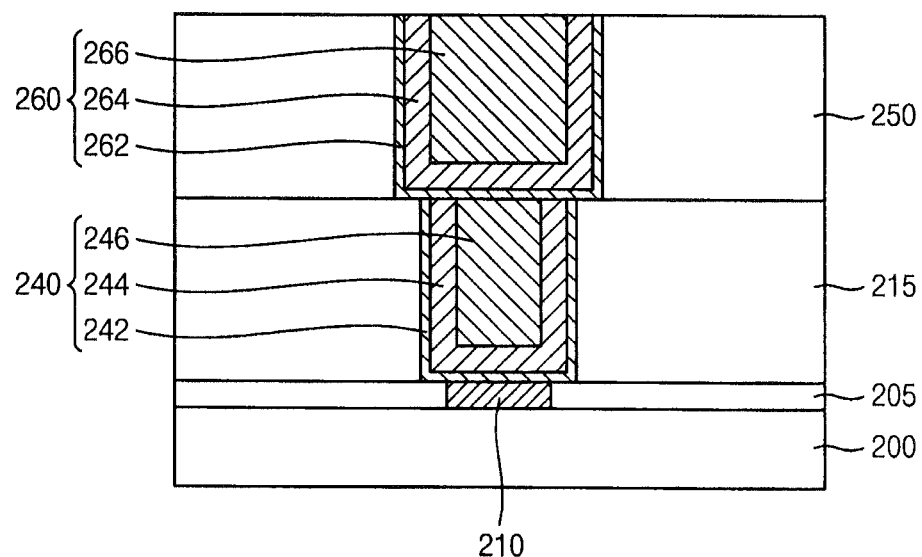

Referring to FIG. 9B, an additional conductive pattern having a construction substantially the same as or similar to that of a first conductive pattern 240 may be formed on the first conductive pattern 240. For example, the first conductive pattern 240 may include a first barrier conductive layer pattern 242, a first seed layer pattern 244 and a first plated layer pattern 246.

A process substantially the same as or similar to that illustrated with reference to FIG. 4 may be performed to form an upper insulating interlayer 250 on the insulating interlayer 214 and the first conductive pattern 240. The upper insulating interlayer 250 may be partially removed to form an opening through which the first conductive pattern 240 is at least partially exposed.

Processes substantially the same as or similar to those illustrated with reference to FIGS. 5 to 8 may be performed to form a second conductive pattern 260 including a second barrier conductive layer pattern 262, a second seed layer pattern 264 and a second plated layer pattern 266 in the opening.

The first and second conductive patterns 240 and 260 may at least partially overlap each other, and may serve as a stack via structure extending vertically with respect to a top surface of the substrate 200.

In an embodiment, the RF sputtering process and the DC sputtering process may be combined to form the seed layer 225, and then the plated layer 227 may be formed by the electroplating process. Thus, the conductive pattern 230 providing an interconnection between wirings may be formed. For example, the seed layer 225 and the plated layer 227 may include copper that may have a great resistance to an electromigration. Thus, the conductive pattern 230 may serve as a conductive structure including, e.g., a via structure, a plug or a contact having a minute line width less than, e.g., about 20 nm or about 15 nm in a highly integrated semiconductor device.

Figure 10A:
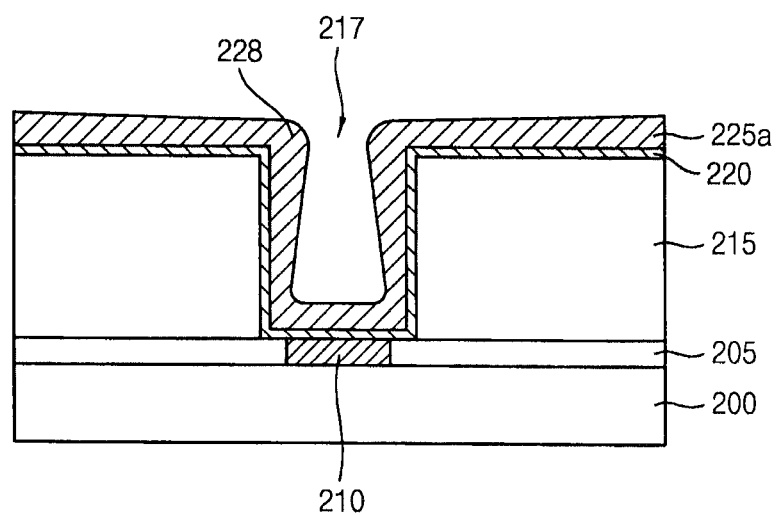
FIGS. 10A and 10B are cross-sectional views illustrating seed layers formed in accordance with comparative examples.
Figure 10B:
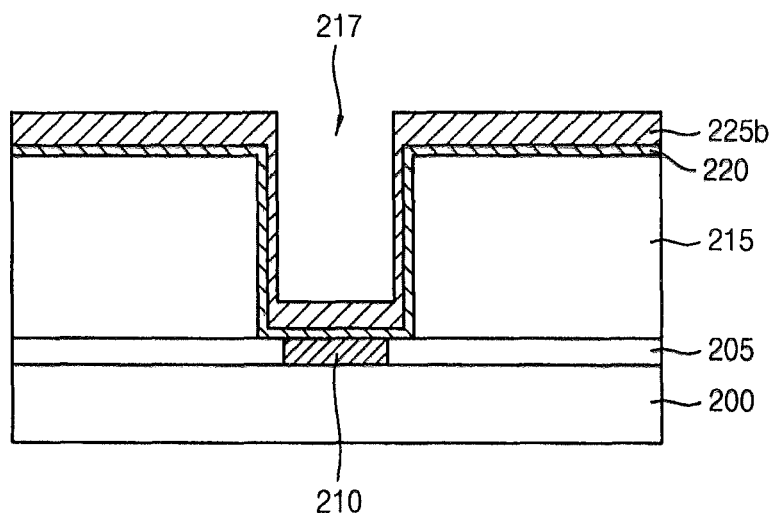

FIGS. 10A and 10B are cross-sectional views illustrating seed layers formed in accordance with comparative examples. FIGS. 10A and 10B illustrate profiles of the seed layers formed solely by a DC sputtering process and an RF sputtering process, respectively.

Referring to FIG. 10A, if a seed layer 225a is formed solely by a DC sputtering process or a DC magnetron sputtering, the seed layer 225a may have a poor step coverage and may have a irregular thickness along the barrier conductive layer 220. Further, a horizontal deposition may be prevalent in the DC sputtering process, and thus the seed layer 225a may include an overhang 228 at an entrance of the opening 217. As a result, the entrance of the opening 217 may be closed during a subsequent electroplating process to cause a void in a plated layer.

Referring to FIG. 10B, if a seed layer 225b is formed solely by a RF sputtering process, a vertical deposition may be prevalent so that the overhang illustrated in FIG. 10A may not occur. However, thicknesses of the seed layer 225b on an upper portion of the insulating interlayer 215 and a bottom of the opening 217 may be increased, and a thickness of the seed layer 225b on a sidewall of the opening 217 may be excessively reduced. Thus, an irregular formation of a plated layer may be caused in a subsequent electroplating process.

In an embodiment, the DC sputtering process and the RF sputtering process may be performed independently of each other and alternately so that disadvantages of both sputtering processes may be compensated. Thus, the seed layer 225 having a uniform profile and an improved step coverage may be achieved.

In an embodiment, the RF sputtering process may be performed to form the seed layer 225b of FIG. 10B, and then the DC sputtering process may be performed. In this case, copper ion active species generated from the copper target may be collided with a portion of the seed layer 225b on the bottom of the opening 217. As a result, copper atoms and/or copper ions may be separated from the seed layer 225b to be migrated to a portion of the seed layer 225b on the sidewall of the opening 217. Thus, the seed layer 225 may be formed uniformly along an innerwall of the opening 217 as illustrated in FIG. 6.

In an embodiment, the DC sputtering process may be performed to form the seed layer 225a of FIG. 10A, and then the RF sputtering process may be performed. In this case, the overhang 228 may be removed by active species vertically collided therewith to form the seed layer 225 having a uniform profile.

Therefore, a mechanical or a physical failure such as a void may be prevented while performing the electroplating process for the formation of the plated layer 227.

FIGS. 11 to 19 are cross-sectional views illustrating a method of forming a conductive pattern in accordance with an exemplary embodiment.

Figure 11:
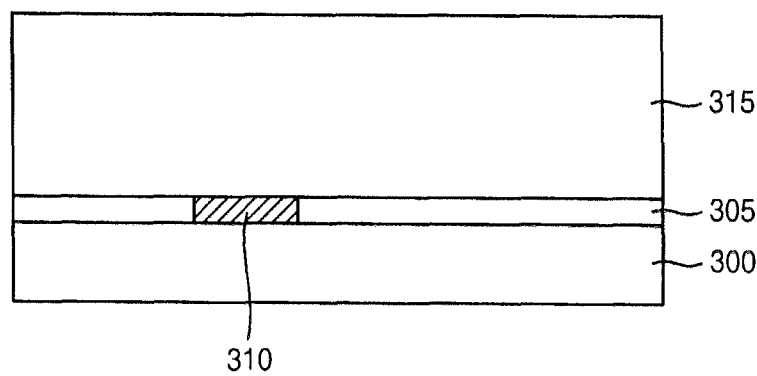

Referring to FIG. 11, a process substantially the same as or similar to that illustrated with reference to FIG. 3 may be performed. Accordingly, a lower insulation layer 305 and a lower wiring 310 may be formed on a substrate 300. An insulating interlayer 315 may be formed on the lower insulation layer 305 and the lower wiring 310.

Figure 12:
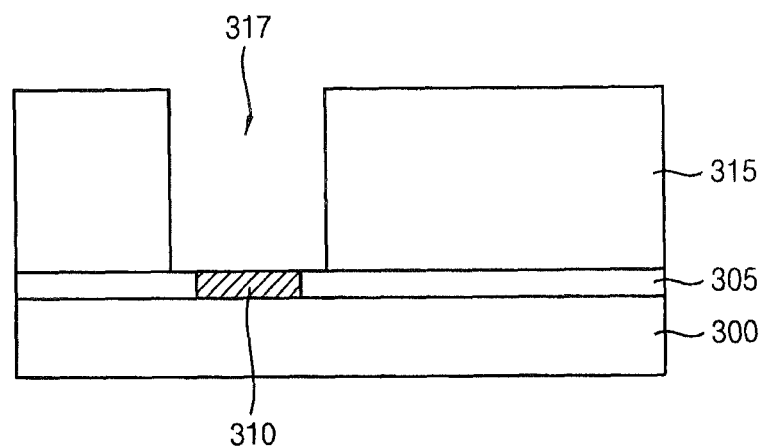

Referring to FIG. 12, a process substantially the same as or similar to that illustrated with reference to FIG. 4 may be performed to form a first opening 317. A top surface of the lower wiring 310 may be at least partially exposed through the first opening 317.

Figure 13:
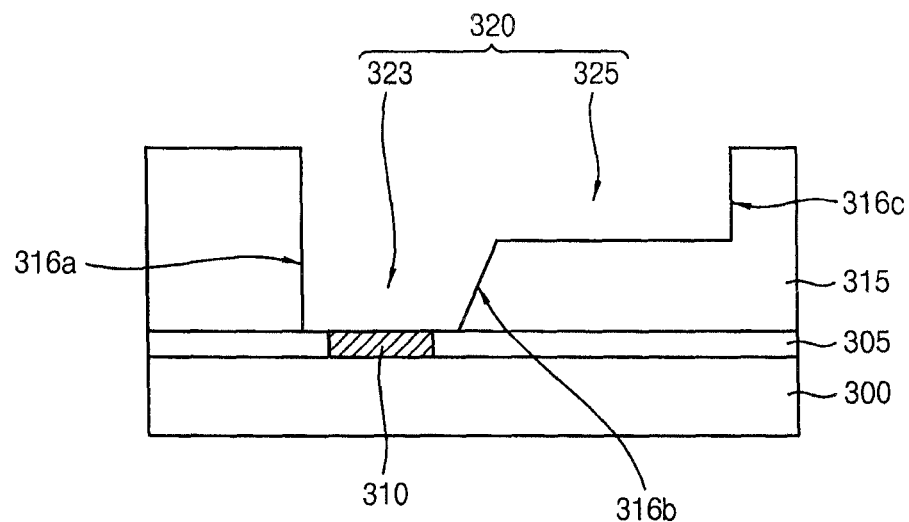

Referring to FIG. 13, an upper portion of the first opening 317 may be expanded to form a second opening 320.

In an embodiment, an upper portion of the insulating interlayer 315 may be further removed such that the upper portion of the first opening 317 may be expanded in a specific direction. Accordingly, the second opening 320 may include an upper portion 325 and a lower portion 323, and the upper portion 325 may have a width or a diameter greater than the lower portion 323.

Sidewalls of the second opening 320 may be divided into a first sidewall 316a, a second sidewall 316b and a third sidewall 316c. The first sidewall 316a may serve as a common sidewall of the upper portion 325 and the lower portion 323. The lower portion 323 may be defined by the first sidewall 316a and the second sidewall 316b, and the upper portion 325 may be defined by the first sidewall 316a and the third sidewall 316c.

In an embodiment, the second sidewall 316b may be tapered with respect to a top surface of the substrate 300 due to succesive etching processes for the first and second openings 317 and 320. In an embodiment, the first and third sidewalls 316a and 316c may be substantially vertical with respect to the top surface of the substrate 300, and the second sidewall 316b may be tapered by a predetermined angle.

Figure 14:
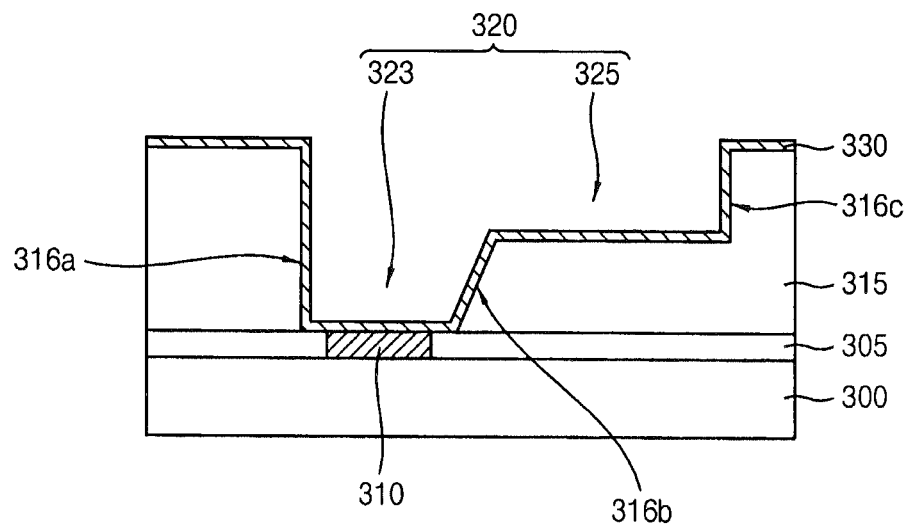

Referring to FIG. 14, a process substantially the same as or similar to that illustrated with reference to FIG. 5 may be performed to form a barrier conductive layer 330 on a top surface of the insulating interlayer 315 and on the sidewalls and a bottom of the second opening 320.

The barrier conductive layer 330 may be formed to have a thin thickness conformably on the first sidewall 316a, a bottom and the second sidewall 316b of the lower portion 323, and a bottom and the third sidewall 316c of the upper portion 325.

Figure 15:
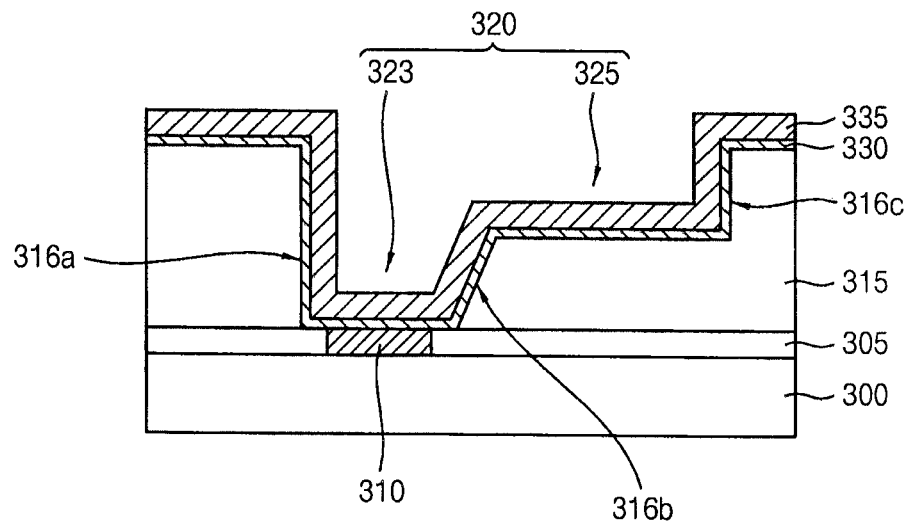

Referring to FIG. 15, a process substantially the same as or similar to that illustrated with reference to FIG. 6 may be performed to form a seed layer 335 on the barrier conductive layer 330. In an embodiment, the seed layer 335 may be formed by a combination of a RF sputtering process and a DC sputtering process utilizing the layer deposition system illustrated in FIG. 1 or FIG. 2. Accordingly, the seed layer 335 may be formed uniformly along the bottoms and the sidewalls 316a, 316b and 316c of the second opening 320.

Figure 16:
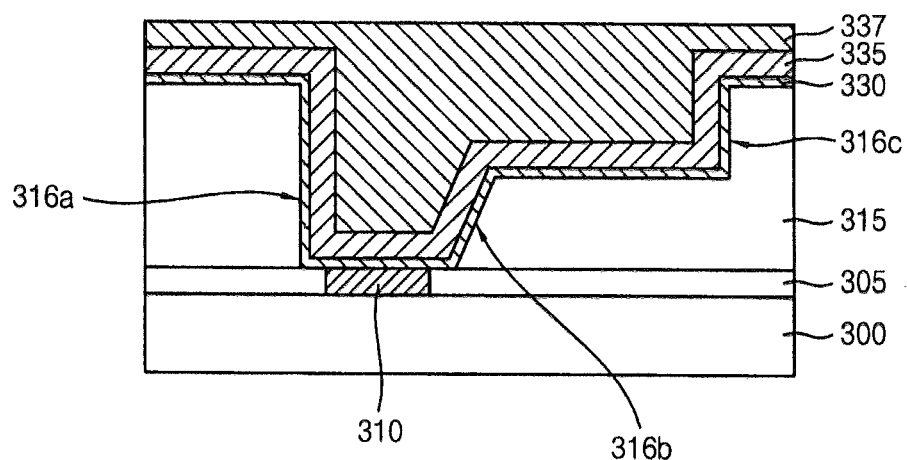

Referring to FIG. 16, a process substantially the same as or similar to that illustrated with reference to FIG. 7 may be performed to form a plated layer 337 on the seed layer 335. For example, the plated layer 337 may be formed by an electroplating process to sufficiently fill the second opening 320.

Figure 17:
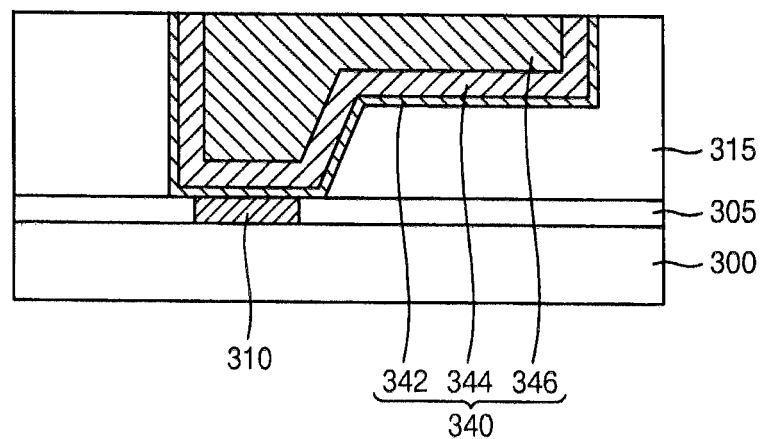

Referring to FIG. 17, a process substantially the same as or similar to that illustrated with reference to FIG. 6 may be performed. Accordingly, upper portions of the plated layer 337, the seed layer 335 and the barrier conductive layer 330 may be planarized to form a first plated layer pattern 346, a first seed layer pattern 344 and a first barrier conductive layer pattern 342. Thus, a first conductive pattern 340 including the first barrier conductive layer pattern 342, the first seed layer pattern 344 and the first plated layer pattern 346 sequentially stacked may be formed in the second opening 320. The first conductive pattern 340 may be in contact with or electrically connected to the lower wiring 310. In an embodiment, the first conductive pattern 340 may have an expanded via structure including an expanded portion extending linearly at an upper portion thereof.

Figure 18:
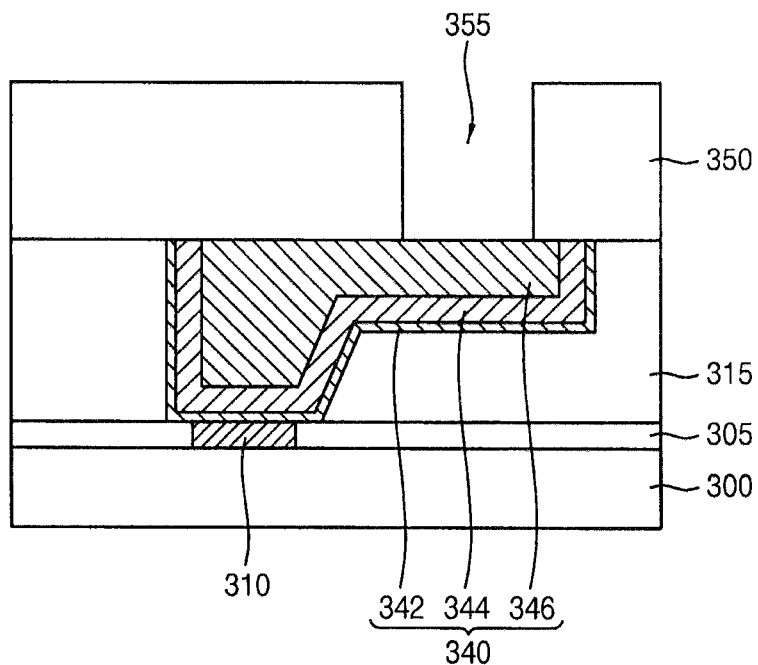

Referring to FIG. 18, an upper insulating interlayer 350 may be formed on the insulating interlayer 315 and the first conductive pattern 340. The upper insulating interlayer 350 may be partially removed to form a third opening 355 through which the expanded portion of the first conductive pattern 340 is at least partially exposed.

Figure 19:
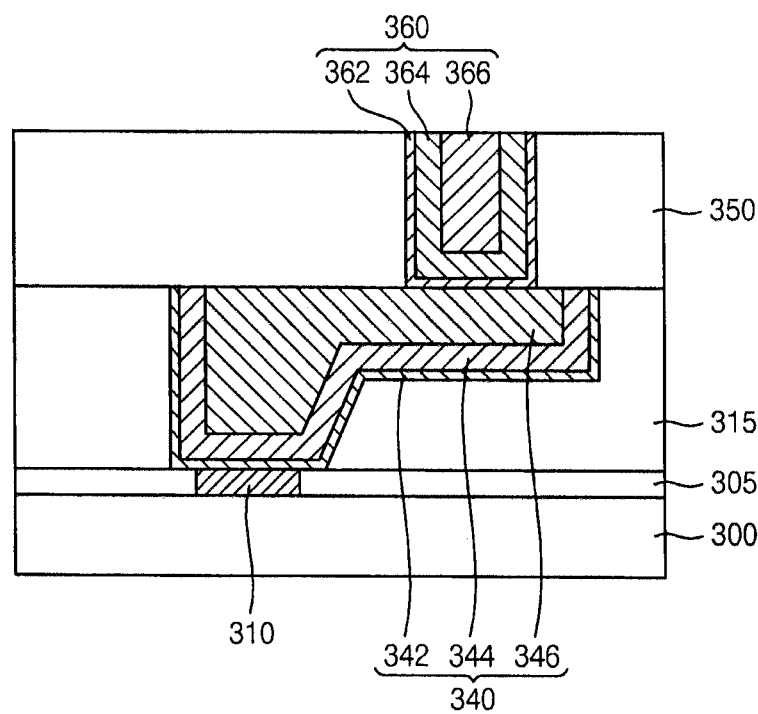

Referring to FIG. 19, processes substantially the same as or similar to those illustrated with reference to FIGS. 5 to 8 may be performed. Accordingly, a second conductive pattern 360 including a second barrier conductive layer pattern 362, a second seed layer pattern 364 and a second plated layer pattern 366 sequentially stacked in the third opening 355 may be formed to be electrically connected to the first conductive pattern 340.

In an embodiment, an interconnection between the lower wiring 310 and the second conductive pattern 360 may be formed via the expanded portion of the first conductive pattern 340.

Figure 20A:
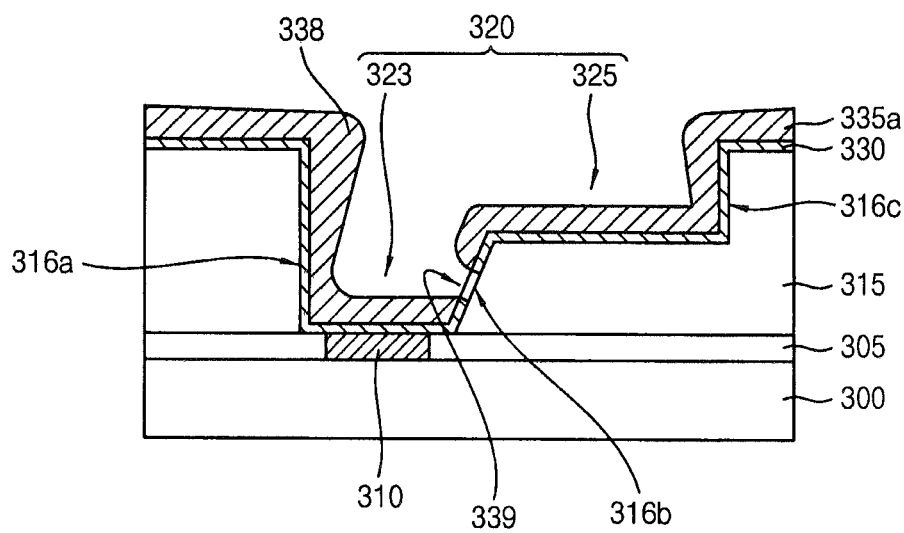
FIGS. 20A and 20B are cross-sectional views illustrating seed layers formed in accordance with a comparative example.
Figure 20B:
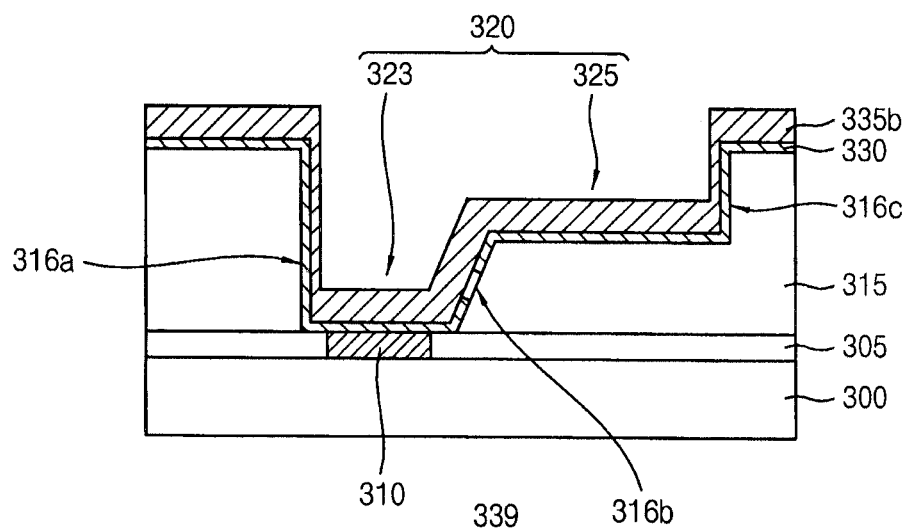

FIGS. 20A and 20B are cross-sectional views illustrating seed layers formed in accordance with comparative examples. FIGS. 20A and 20B illustrate profiles of the seed layers formed solely by a DC sputtering process and an RF sputtering process, respectively.

Referring to FIG. 20A, if a seed layer 335a is formed solely by a DC sputtering process or a DC magnetron sputtering, the seed layer 335a may have a poor step coverage and may have an irregular thickness along the barrier conductive layer 330. Further, a horizontal deposition may be prevalent in the DC sputtering process, and thus the seed layer 335a may include an overhang 338 at an entrance of the second opening 320. A discontinuity of the seed layer 335a may be caused on the second sidewall 316b of the lower portion 323 in the second opening 320. Thus, a void may be caused by a discontinuous region 339 while forming a plated layer on the seed layer 335a.

Referring to FIG. 20B, if a seed layer 335b is formed solely by a RF sputtering process, a vertical deposition may be prevalent so that the overhang 338 and the discontinuity region 339 illustrated in FIG. 20A may not occur. However, thicknesses of the seed layer 335b on an upper portion of the insulating interlayer 315 and a bottom of the second opening 320 may be increased, and a thickness of the seed layer 335b on a sidewall of the second opening 320, e.g., the first sidewall 316a and the third sidewall 316c may be excessively reduced. Thus, an irregular formation of the plated layer may be caused in a subsequent electroplating process.

However, according to an embodiment, the DC sputtering process and the RF sputtering process may be performed independently and alternately so that disadvantages of both sputtering processes may be compensated. Thus, the seed layer 335 having a uniform profile and an improved step coverage may be achieved.

FIGS. 21 to 24 are cross-sectional views illustrating a method of forming a conductive pattern in accordance with an exemplary embodiment.

Figure 21:
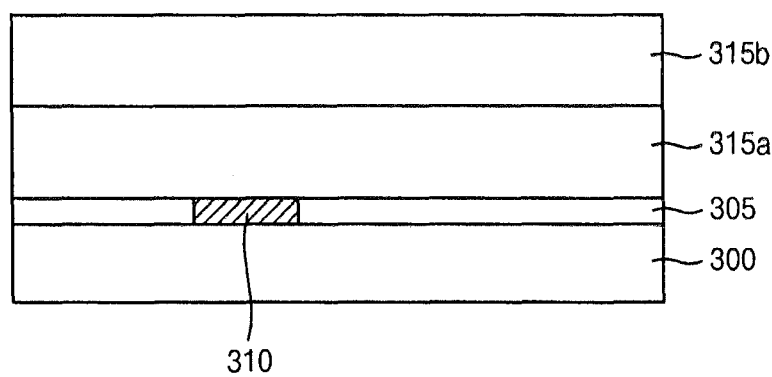

Referring to FIG. 21, processes substantially the same as or similar to those illustrated with reference to FIGS. 3 to 11 may be performed to form a lower insulation layer 305 and a lower wiring 310 on a substrate 300. A first insulating interlayer 315a may be formed on the lower insulation layer 305 and the lower wiring 310, and then a second insulating interlayer 315b may be formed on the first insulating interlayer 315a. In an embodiment, the first and second insulating interlayers 315a and 315b may be formed using the same or different oxide-based materials.

Figure 22:
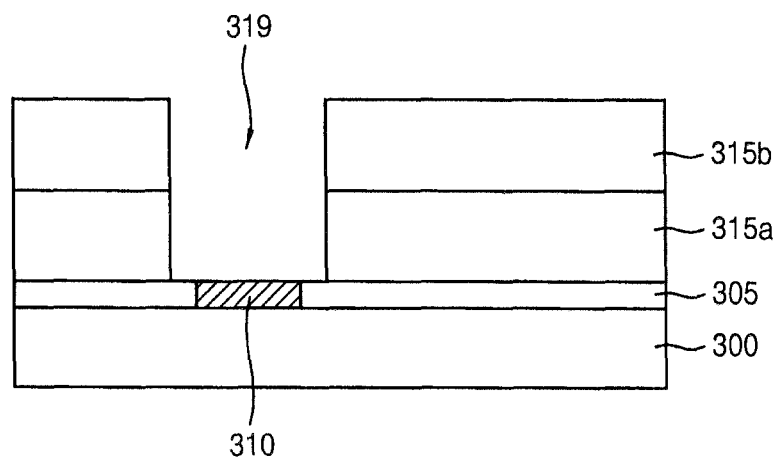

Referring to FIG. 22, processes substantially the same as or similar to those illustrated with reference to FIGS. 4 to 12 may be performed to form a first opening 319. In example embodiments, the first opening 319 may extend through the second insulating interlayer 315b and the first insulating interlayer 315a to at least partially expose a top surface of the lower wiring 310.

Figure 23:
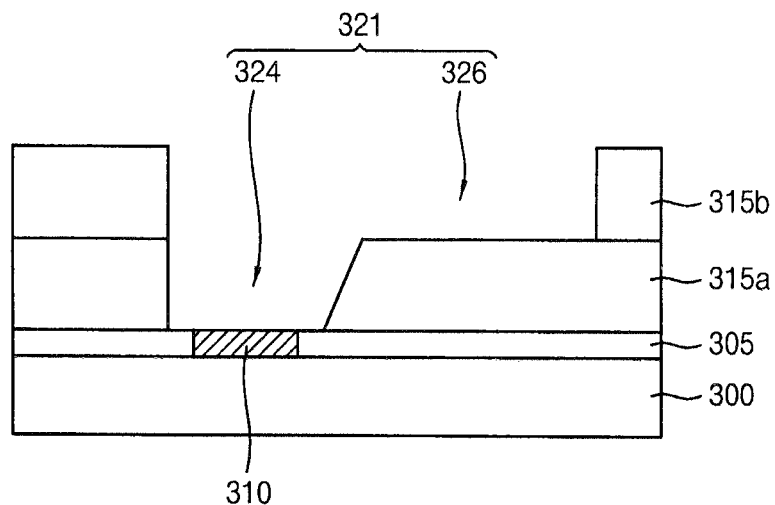

Referring to FIG. 23, a process substantially the same as or similar to that illustrated with reference to FIG. 13 may be performed. Accordingly, an upper portion of the first opening 319 may be expanded to form a second opening 321.

The second opening 321 may be divided into an upper portion 326 and a lower portion 324, and the upper portion 326 may have a width or a diameter greater than that of the lower portion 324. In an embodiment, a boundary between the upper and lower portions 326 and 324 may be defined by an interface between the first insulating interlayer 315a and the second insulating interlayer 315b. In this case, the lower portion 324 of the second opening 321 may be defined in the first insulating interlayer 315a, and the upper portion 326 of the second opening 321 may be defined in the second insulating interlayer 315b.

Figure 24:
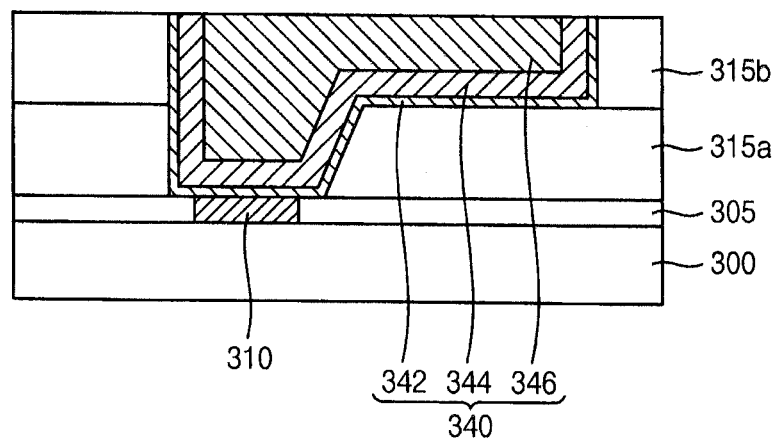

Referring to FIG. 24, processes substantially the same as or similar to those illustrated with reference to FIGS. 14 to 17 may be performed. Accordingly, a first conductive pattern 340 including a first barrier layer pattern 342, a first seed layer pattern 344 and a first plated layer pattern 346 sequentially stacked in the second opening 321 may be formed to be electrically connected to the lower wiring 310. The first conductive pattern 340 may have an expanded via structure including an expanded portion extending linearly at the upper portion 326 of the second opening 321.

Processes substantially the same as or similar to those illustrated with reference to FIGS. 18 and 19 may be performed to form a second conductive pattern stacked on the first conductive pattern 340.

FIGS. 25 to 30 are cross-sectional views illustrating a method of manufacturing a semiconductor device in accordance with example embodiments.

Figure 25:
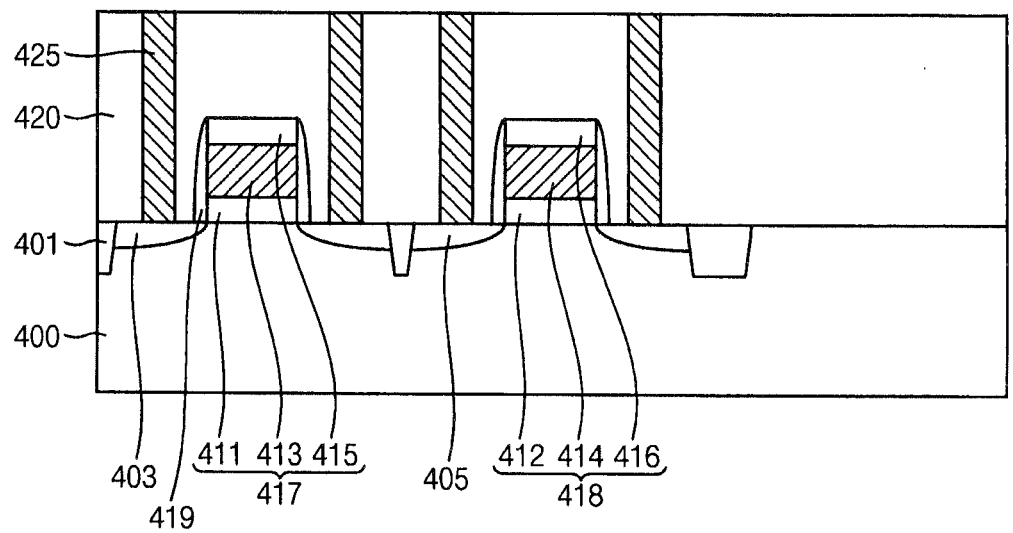

Referring to FIG. 25, a front-end-of-line (FEOL) process may be performed on a substrate 400.

In example embodiments, a shallow trench isolation (STI) process may be performed on the substrate 400 including, e.g., single crystalline silicon to form an isolation layer 401. The substrate 400 may be divided into an active region and a field region by the isolation layer 401.

A circuit device may be formed on the active region of the substrate. For example, the circuit device may include a transistor and a contact.

A gate insulation layer, a gate electrode layer and a gate mask layer may be sequentially formed on the substrate 400, and then partially etched by a photolithography process to form a first gate structure 417 and a second gate structure 418. The first gate structure 417 may include a first gate insulation layer pattern 411, a first gate electrode 413 and a first gate mask 415. The second gate structure 418 may include a second gate insulation layer pattern 412, a second gate electrode 414 and a second gate mask 416.

The gate insulation layer may be formed using silicon oxide by a CVD process or a thermal oxidation process. The gate electrode layer may be formed using doped polysilicon, a metal or a metal nitride by a sputtering process or an ALD process. The gate mask layer may be formed using silicon nitride by a CVD process, a spin coating process, etc.

Impurities may be implanted using the first and second gate structures 417 and 418 as ion-implantation masks to form a first impurity region 403 and a second impurity region 405 at upper portions adjacent to the first gate structure 417 and the second gate structure 418, respectively. In example embodiments, the first impurity region 403 may include n-type impurities such as phosphorous (P) or arsenic (As). In this case, an n-channel metal oxide semiconductor (NMOS) transistor may be defined by the first impurity region 403 and the first gate structure 417. The second impurity region 405 may include p-type impurities such as boron (B) or gallium (Ga). In this case, a p-channel metal oxide semiconductor (PMOS) transistor may be defined by the second impurity region 405 and the second gate structure 418. Accordingly, a complementary metal oxide semiconductor (CMOS) transistor may be formed on the substrate 400.

A gate spacer 419 may be further formed on sidewalls of the first and second gate structures 417 and 418. For example, a spacer layer covering the first and second gate structures 417 and 418 may be formed on the substrate 400. The spacer layer may be anisotropically etched to form the gate spacer 419. The spacer layer may be formed using silicon nitride by a CVD process or a spin coating process, etc.

A first insulating interlayer 420 covering the first and second gate structures 417 and 418 may be formed on the substrate 400. Contacts 425 may be formed through the first insulating interlayer 420 to be electrically connected to the first and second impurity regions 403 and 405.

For example, the first insulating interlayer 420 may be formed using silicon oxide such as TEOS by, e.g., a CVD process or a spin coating process. The first insulating interlayer 420 may be partially etched to form contact holes through which the first and second impurity regions 403 and 405 are exposed. A first conductive layer sufficiently filling the contact holes may be formed on the first insulating interlayer 420, and an upper portion of the first conductive layer may be planarized until a top surface of the first insulating interlayer 420 is exposed to form the contacts 425.

In an embodiment, the contact 425 may be self-aligned with the gate spacer 419. In an embodiment, the contact 425 is in contact with a sidewall of the gate spacer 419.

Figure 26:
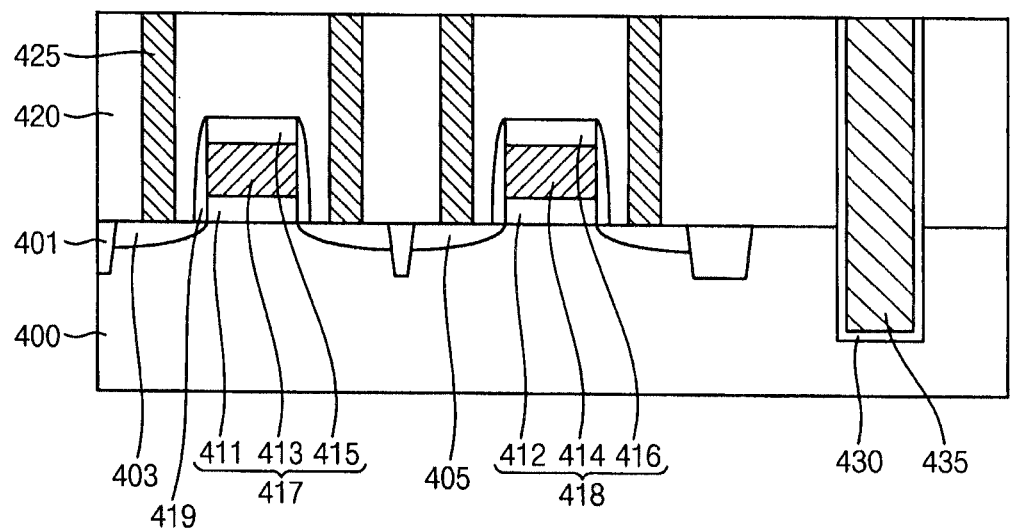

Referring to FIG. 26, a through electrode 435 extending through the first insulating interlayer 420 may be formed. The through electrode 435 may extend at least partially through the substrate 400. An insulation layer pattern 430 surrounding a sidewall and a bottom of the through electrode 435 may be formed.

In example embodiments, the first insulating interlayer 420 and the substrate 400 may be partially etched to form a hole. The hole may extend through the first insulating interlayer 420 and partially through the substrate 400. An insulation layer may be formed on the first insulating interlayer 420 and an innerwall of the hole using, e.g., silicon oxide, and a second conductive layer sufficiently filling the hole may be formed on the insulation layer. Upper portions of the second conductive layer and the insulation layer may be planarized until the first insulating interlayer 420 is exposed to form the through electrode 435 and the insulation layer pattern 430. In an example embodiment, the second conductive layer may have a multi-stacked structure including a barrier conductive layer, a seed layer and a plated layer.

A back-end-of-line (BEOL) process may be performed to form an interconnection structure electrically connected to the contacts 425 and the through electrode 435.

Figure 27:
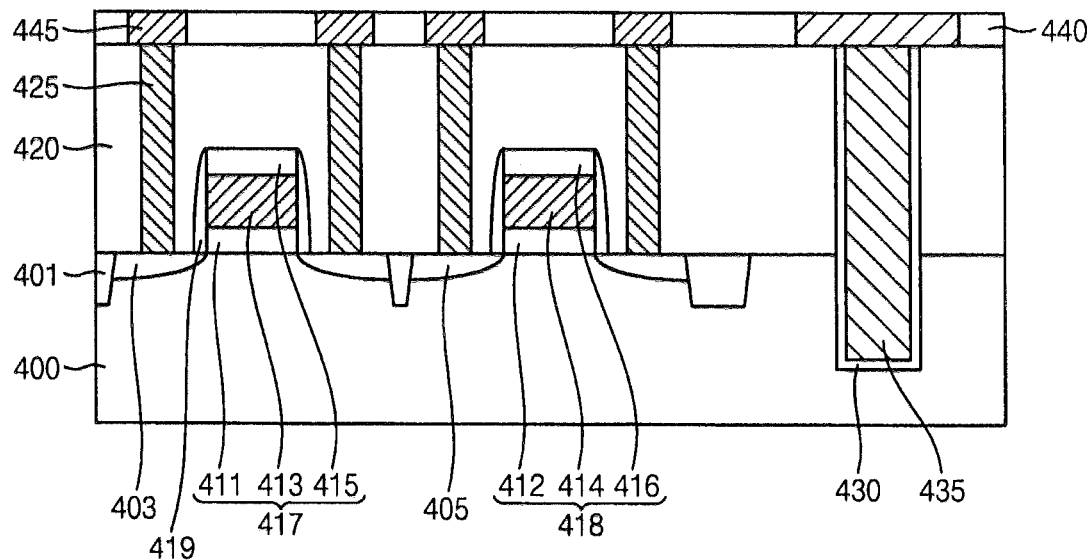

Referring to FIG. 27, lower wirings 445 electrically connected to the contacts 425 and the through electrode 435 may be formed.

In example embodiments, a second insulating interlayer 440 may be formed on the first insulating interlayer 420, and then first openings exposing top surfaces of the contacts 425 and the through electrode 435 may be formed through the second insulating interlayer 440. A third conductive layer sufficiently filling the first openings may be formed, and then an upper portion of the third conductive layer may be planarized until the second insulating interlayer 440 is exposed to form the lower wirings 445. In an example embodiment, the lower wirings 445 may be formed by processes substantially the same as or similar to those illustrated with reference to FIGS. 3 to 6.

Figure 28:
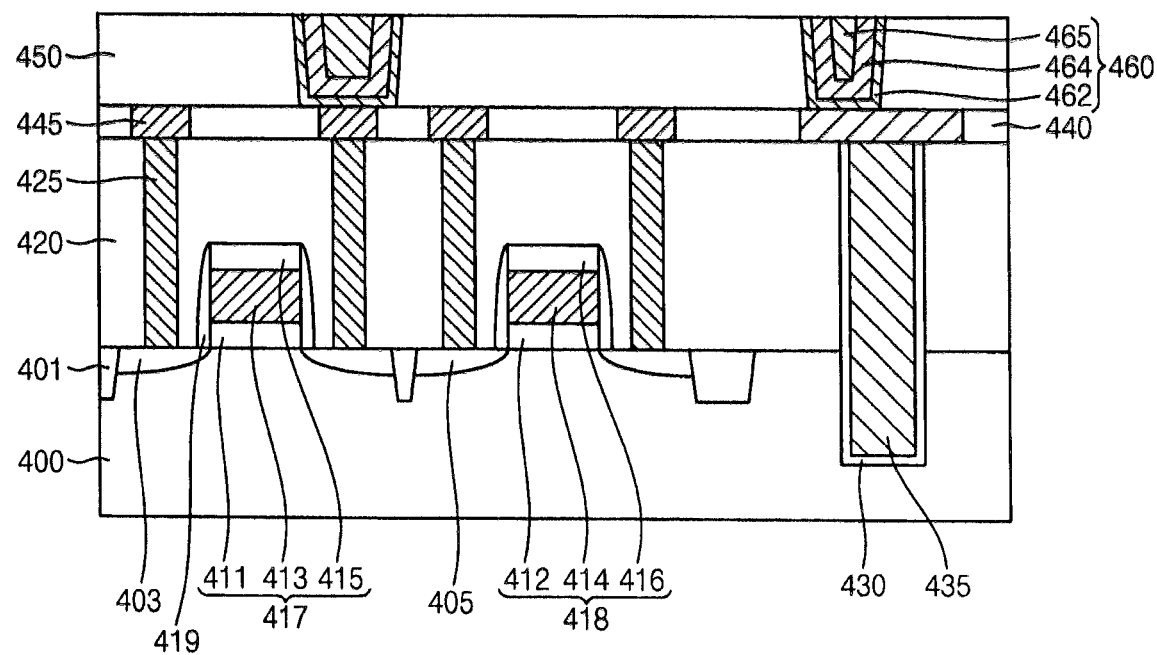

Referring to FIG. 28, processes substantially the same as or similar to those illustrated with reference to FIGS. 3 to 8 may be performed to form a first conductive pattern 460 electrically connected to at least a portion of the lower wirings 445.

In example embodiments, a third insulating interlayer 450 covering the lower wirings 445 may be formed on the second insulating interlayer 440. The third insulating interlayer 450 may be partially etched to form a second opening through which at least the portion of the lower wirings 445 is exposed. A barrier conductive layer pattern 462, a first seed layer pattern 464 and a plated layer pattern 465 may be formed sequentially on an innerwall of the second opening to form the first conductive pattern 460.

As described above, the first seed layer pattern 464 may be formed by a combination of a RF sputtering process and a DC sputtering process.

Figure 29:
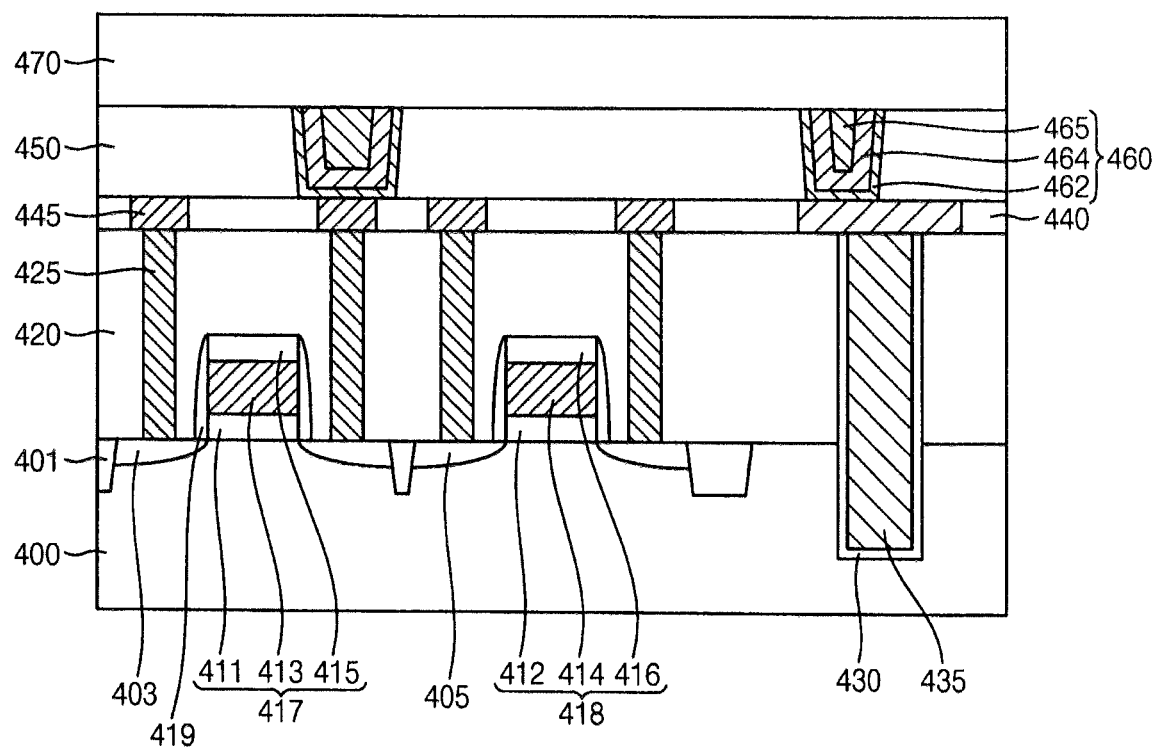

Referring to FIG. 29, a fourth insulating interlayer 470 covering the first conductive pattern 460 may be formed on the third insulating interlayer 450.

Figure 30:
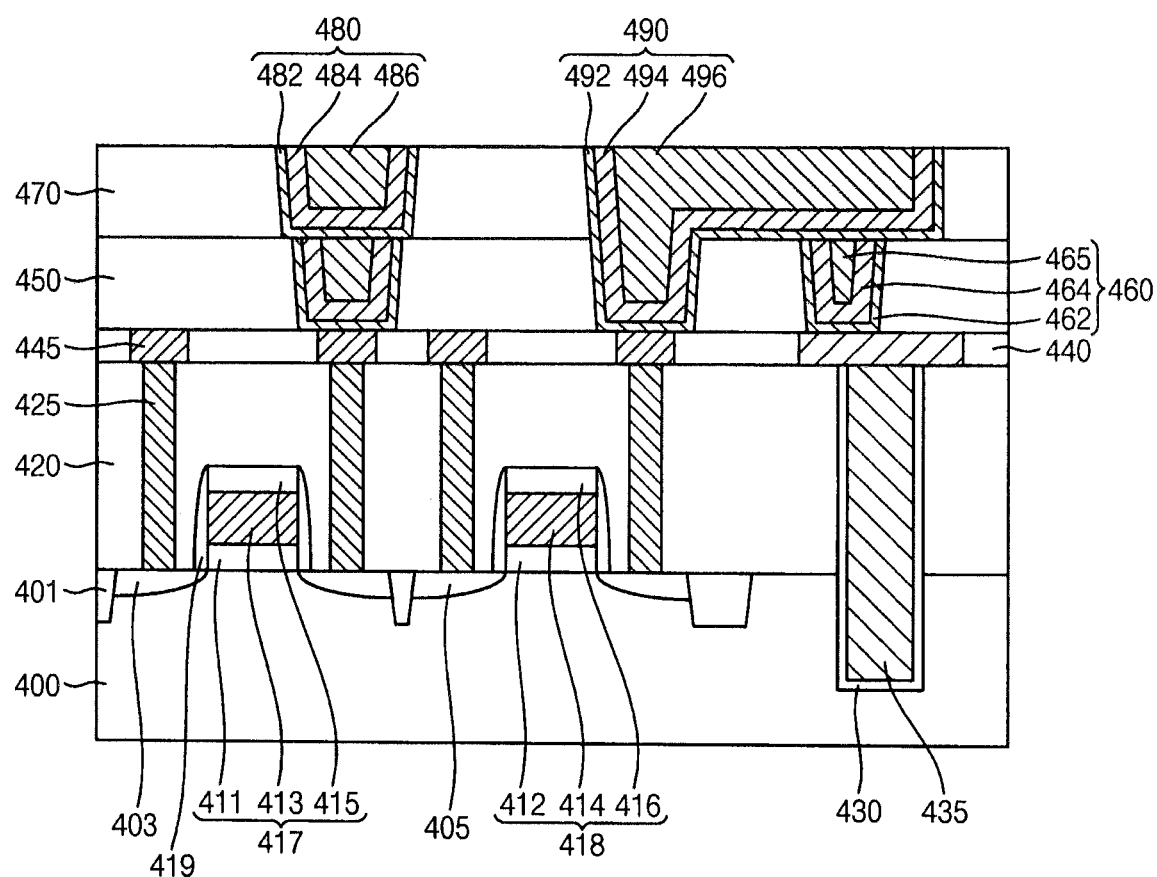

Referring to FIG. 30, processes substantially the same as or similar to those illustrated with reference to FIGS. 3 to 8 may be performed to form a second conductive pattern 480 stacked on the first conductive pattern 460. The second conductive pattern 480 may have a multi-stacked structure including a second barrier conductive layer pattern 482, a second seed layer pattern 484 and a second plated layer pattern 486.

In example embodiments, the first conductive pattern 460 and the second conductive pattern 480 may have a stack via structure stacked in a substantially vertical direction with respect to a top surface of the substrate 400.

In example embodiments, processes substantially the same as or similar to those illustrated with reference to FIGS. 12 to 17, or FIGS. 22 to 24 may be performed to form a third conductive pattern 490 electrically connected to the first conductive pattern 460. The third conductive pattern 490 may a multi-stacked structure including a third barrier conductive layer pattern 492, a third seed layer pattern 494 and a third plated layer pattern 496.

The third conductive pattern 490 may be formed through the fourth insulating interlayer 470 and the third insulating interlayer 450 to contact the lower wiring 445. An upper portion of the third conductive pattern 490 may be extended to contact a top surface of the first conductive pattern 460. A plurality of the lower wirings 445 may be electrically connected to each other via the third conductive pattern 490.

In an example embodiment, the impurity region, e.g., the second impurity region 405 of the transistor may be electrically connected to the through electrode 435 via the third conductive pattern.

In example embodiments, the second and third conductive patterns 480 and 490 may be formed simultaneously by the same process step.

In an example embodiment, additional conductive patterns or interconnection structures may be formed on the second and third conductive patterns 480 and 490. After the BEOL process, a lower portion of the substrate 400 may be polished to expose a bottom of the through electrode 435. An additional semiconductor device may be connected to the bottom of the through electrode 435.

As described above, layer deposition systems and methods of forming conductive patterns in accordance with example embodiments may be implemented to form an interconnection structure having an enhanced reliability in a via hole or a trench of a minute line width, e.g., less than about 20 nm or about 15 nm.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:
    forming an insulating interlayer on a substrate;
    partially removing the insulating interlayer to form an opening;
    forming a barrier conductive layer on a sidewall and a bottom of the opening;
    performing a radio frequency (RF) sputtering process and a direct current (DC) sputtering process independently on the barrier conductive layer to form a seed layer; and
    forming a plated layer on the seed layer.

2. The method of claim 1, wherein the RF sputtering process and the DC sputtering process are performed alternately and repeatedly.

3. The method of claim 1, wherein the RF sputtering process and the DC sputtering process are performed in different process chambers.

4. The method of claim 1, wherein the RF sputtering process includes applying a high frequency (HF)-RF power ranging from about 40 kHz to about 40 MHz, and the DC sputtering process includes a DC magnetron sputtering process.

5. The method of claim 1, further comprising forming a lower wiring on the substrate,
    wherein the lower wiring is at least partially exposed through the opening.

6. The method of claim 5, wherein the opening includes a lower portion exposing the lower wiring, and an upper portion having a greater width than that of the lower portion.

7. The method of claim 6, wherein the opening includes:
    a first sidewall extending commonly throughout the upper portion and the lower portion;
    a second sidewall defining the lower portion together with the first sidewall; and
    a third sidewall defining the upper portion together with the first sidewall,
    wherein the second sidewall is tapered with respect to a top surface of the substrate relatively to the first sidewall and the third sidewall.

8. The method of claim 6, wherein forming the insulating interlayer includes forming a first insulating interlayer and a second insulating interlayer sequentially on the substrate,
    wherein a boundary between the upper portion and the lower portion is defined by an interface between the first insulating interlayer and the second insulating interlayer.

9. The method of claim 1, wherein the seed layer includes copper, and the plated layer is grown from the seed layer by an electroplating process.

10. A method of manufacturing a semiconductor device, comprising:
    forming a circuit device on a substrate;
    forming a first insulating interlayer covering the circuit device;
    forming lower wirings electrically connected to the circuit device on the first insulating interlayer;
    forming a second insulating interlayer on the lower wirings and the first insulating interlayer;
    partially removing the second insulating interlayer to form a first opening through which at least a portion of the lower wirings is exposed;
    forming a first barrier conductive layer pattern on a sidewall and a bottom of the first opening;

performing a RF sputtering process and a DC sputtering process independently and alternately on the first barrier conductive layer pattern to form a first seed layer pattern; and forming a first plated layer pattern on the first seed layer pattern such that a first conductive pattern including the first barrier conductive layer pattern, the first seed layer pattern and the first plated layer pattern sequentially stacked in the first opening is formed.

11. The method of claim 10, further comprising:

forming a third insulating interlayer covering the first conductive pattern on the second insulating interlayer;

partially removing the third insulating interlayer to form a second opening through which the first conductive pattern is exposed;

forming a second barrier conductive layer pattern on a sidewall and a bottom of the second opening;

performing a RF sputtering process and a DC sputtering process independently of each other and alternately on the second barrier conductive layer pattern to form a second seed layer pattern; and forming a second plated layer pattern on the second seed layer pattern such that a second conductive pattern including the second barrier conductive layer pattern, the second seed layer pattern and the second plated layer pattern sequentially stacked in the second opening is formed.

12. The method of claim 10, further comprising:

forming a third insulating interlayer covering the first conductive pattern on the second insulating interlayer;

partially removing the third insulating interlayer and the second insulating interlayer to form a third opening through which the lower wiring is exposed;

expanding an upper portion of the third opening;

forming a third barrier conductive layer pattern on a sidewall and a bottom of the third opening;

performing an RF sputtering process and a DC sputtering process independently of each other and alternately on the third barrier conductive layer pattern to form a third seed layer pattern; and forming a third plated layer pattern on the third seed layer pattern such that a third conductive pattern including the third barrier conductive layer pattern, the third seed layer pattern and the third plated layer pattern sequentially stacked in the third opening is formed.

13. The method of claim 12, wherein the first conductive pattern is exposed through the upper portion of the third opening.

14. The method of claim 13, further comprising forming a through electrode extending through the first insulating interlayer and at least partially through the substrate, wherein the through electrode is electrically connected to at least a portion of the lower wirings.

15. The method of claim 14, wherein the through electrode is electrically connected to a portion of the third conductive pattern formed in the upper portion of the third opening via the first conductive pattern.

16. A method of manufacturing a semiconductor device, comprising:

loading a semiconductor substrate in an RF sputtering chamber including a first target therein;

applying an RF power to the first target such that a first conductive layer is deposited on the semiconductor substrate;

loading the semiconductor substrate in a DC sputtering chamber including a second target therein; and applying a DC power to the second target such that a second conductive layer is deposited on the semiconductor substrate.

17. The method of claim 16, wherein the semiconductor substrate is loaded alternately and repeatedly in the RF sputtering chamber and the DC sputtering chamber, and the first conductive layer and the second conductive layer are deposited alternately and repeatedly.

18. The method of claim 16, wherein a bias power is applied to the semiconductor substrate through a bias power supply commonly coupled to the RF sputtering chamber and the DC sputtering chamber.

19. The method of claim 16, wherein a DC power is applied to the first target together with the RF power, and wherein the DC power applied to the first target ranges from about 1 kW to about 8 kW, and the DC power applied to the second target ranges from about 10 kW to about 30 kW.

20. The method of claim 16, wherein the first and second targets include copper.

* * * * *